(12) United States Patent
Matheson

(10) Patent No.: US 7,267,459 B2
(45) Date of Patent: Sep. 11, 2007

(54) SEALED HOUSING UNIT FOR LIGHTING SYSTEM

(75) Inventor: George Matheson, North Vancouver (CA)

(73) Assignee: TIR Systems Ltd. (CA)

( * ) Notice: Subject to any disclaimer, the term of this patent is extended or adjusted under 35 U.S.C. 154(b) by 58 days.

(21) Appl. No.: 11/046,157

(22) Filed: Jan. 28, 2005

(65) Prior Publication Data
US 2005/0213328 A1   Sep. 29, 2005

Related U.S. Application Data

(60) Provisional application No. 60/557,386, filed on Mar. 30, 2004.

(30) Foreign Application Priority Data
Jan. 28, 2004   (CA) .................................. 2456388

(51) Int. Cl.
B60Q 3/04 (2006.01)
(52) U.S. Cl. ....................................... 362/362; 362/240
(58) Field of Classification Search ................ 362/362, 362/240
See application file for complete search history.

(56) References Cited

U.S. PATENT DOCUMENTS

| | | | |
|---|---|---|---|
| 4,755,917 A | | 7/1988 | Bals et al. |
| 4,781,960 A | | 11/1988 | Wittes |
| 4,809,144 A | * | 2/1989 | Suzuki ........................ 362/547 |
| 5,722,767 A | | 3/1998 | Lin |
| 5,848,837 A | | 12/1998 | Gustafson |
| 5,927,845 A | | 7/1999 | Gustafson et al. |
| 6,002,585 A | | 12/1999 | Leeb |
| 6,113,248 A | | 9/2000 | Mistopoulos et al. |
| 6,428,189 B1 | * | 8/2002 | Hochstein .................... 362/373 |
| 6,480,389 B1 | | 11/2002 | Shie et al. |
| 6,673,292 B1 | | 1/2004 | Gustafson et al. |
| 6,673,293 B1 | * | 1/2004 | Mistopoulos et al. ....... 264/149 |
| 6,726,348 B2 | * | 4/2004 | Gloisten ...................... 362/372 |
| 6,812,481 B2 | * | 11/2004 | Matsumura et al. .......... 257/13 |

FOREIGN PATENT DOCUMENTS

| | | |
|---|---|---|
| CA | 2342267 | 9/2001 |
| DE | 3626726 | 2/1988 |
| WO | WO2004/107461 | 12/2004 |

OTHER PUBLICATIONS

Supplementary European Search Report, European Patent Application No. 05706419.8, mailed on Apr. 10, 2007.

* cited by examiner

Primary Examiner—Ali Alavi
Assistant Examiner—Evan Dzierzynski
(74) Attorney, Agent, or Firm—Dorsey & Whitney LLP

(57) ABSTRACT

The present invention provides a sealed housing unit and a method for its manufacture, wherein the sealed housing unit can protect light-emitting elements and the connected electronic circuitry from moisture. The sealed housing unit comprises a thermally conductive base onto which an array of light-emitting elements is mounted. A frame is sealingly connected to the thermally conductive base circumferentially enclosing the array of light-emitting elements and connected circuitry. An optically transmissive panel sufficiently sized to span the area defined by the frame, is sealingly connected to the frame to form a sealed cavity enclosing the array of light-emitting elements and the connected circuitry. The light-emitting elements can be electrically activated via electrical wires provided through one or more apertures within the thermally conductive base or the frame. Each aperture comprises a form of sealing means which suppresses the penetration of moisture.

15 Claims, 4 Drawing Sheets

SEALED HOUSING UNIT FOR LIGHTING SYSTEM

CROSS REFERENCE TO RELATED APPLICATIONS

This application claims priority to Canadian Patent Application No. 2,456,388, filed Jan. 28, 2004 and claims the benefit of U.S. Provisional Patent Application No. 60/557,386, filed Mar. 30, 2004; both of which are hereby incorporated herein by reference.

FIELD OF THE INVENTION

The present invention pertains to the field of lighting and in particular to a sealed light-emitting element housing unit.

BACKGROUND

Recent advances in the development of semiconductor and organic light-emitting diodes (LEDs and OLEDs) have made these solid-state devices suitable for use in general illumination applications, including architectural, entertainment, and roadway lighting, for example. Due to their ruggedness, low power requirements, and long life, these devices are becoming increasingly competitive with light sources such as incandescent, fluorescent, and high-intensity discharge lamps.

Early methods of packaging the semiconductor LED die include a lead frame that holds the chip and extends to provide an electrical connection. The chip can then be encapsulated in an epoxy plastic package that may be coloured or shaped. Later LED packagings are tailored for surface mounting the LEDs onto a printed circuit board (PCB) such as disclosed in U.S. Pat. No. 4,781,960, where the LED is mounted in an insulating housing secured by a pair of legs with relatively broad feet which are soldered to conductive pads on the surface of a PCB. The leads of the LED are spot welded to the legs to make electrical connections between the LED and the circuit board.

Electronic devices such as LEDs, however are susceptible to moisture which can interact with the LED die materials and can destroy or cause malfunction of the devices.

U.S. Pat. No. 5,722,767 provides a means to protect a LED system from exposure to moisture. The LED display panel structure comprises a PCB, a front plate having a plurality of through-holes defined therein, a plurality of washers, each of which is provided on a back surface of the front plate in correspondence with each of the through-holes, a plurality of LEDs, each of which is inserted through a central aperture and each of the washers being smaller than a diameter of the LED to be clamped therein. There is also a plurality of holders, each of which has a first recess and a second recess, such that each of the holders receives and holds each of the LEDs in its first recess and is attached on the PCB by water resistant adhesive filled in the second recess. A pair of through-bores between the first recess with the second recess receives a pair of leads which connect each LED to the PCB. In this manner, the circuitry of the LEDs and PCB are protected from moisture. This design, however is specific to a particular and outdated LED packaging and may not be as effective for use with contemporary LEDs and their associated packaging.

In addition, U.S. Pat. Nos. 5,927,845, 5,848,837 and 6,673,292 all define various forms of an integral single piece extruded LED light strip and an associated process for producing such an LED light strip. The light strip includes first and second bus elements spaced apart from one another by a predetermined distance. The light strip also includes at least one LED connected between the first and second bus elements and is illuminated when the first bus element conducts electricity provided from a power source. An extruded plastic material completely encapsulates the first and second bus elements and the LED, and provides a barrier that protects the elements from damage and makes the light strip impermeable to moisture. This solution, however is more specific to linear LED strips and as such is not suitable for planar LED configurations.

Therefore, with LEDs becoming increasingly competitive with other light sources for use outdoors and in environments with high moisture contents, there is an apparent need for a method and apparatus for protecting these devices from moisture that is cost effective and easy to perform and not limited to a more linear arrangement of LEDs.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a sealed housing unit for lighting system. In accordance with an aspect of the present invention, there is provided a sealed housing unit for a lighting system, the sealed housing unit comprising: a thermally conductive base; a frame sealingly connected to the thermally conductive base; an array of light-emitting elements in thermal contact with the thermally conductive base and surrounded by the frame; an optically transmissive panel sealingly connected to the frame; and sealing means associated with the thermally conductive base, the frame and the transmissive panel forming a sealed housing unit enclosing the array of light-emitting elements; wherein said light-emitting elements are electrically connected to a power source through at least one sealing aperture in the thermally conductive base or the frame.

In accordance with another aspect of the present invention there is provided a method for assembling a sealed housing unit for a lighting system, the method comprising the steps of connecting a frame and an array of light-emitting elements to a thermally conductive base; providing electrical connection to the array of light-emitting elements through at least one sealing aperture in the thermally conductive base or frame, and sealingly connecting an optically transmissive panel to the frame; whereby the frame is sealingly connected to the thermally conductive base and the optically transmissive panel to form a sealed housing unit enclosing the array of light-emitting elements.

DETAILED DESCRIPTION OF THE INVENTION

Definitions

The term "light-emitting element" is used to define any device that emits radiation in the visible region of the electromagnetic spectrum when a potential difference is applied across it or a current is passed through it, for example, a semiconductor, organic or polymer light-emitting diode (LED, OLED or PLED, respectively) or other similar devices as would be readily understood. It would be obvious to one skilled in the art that elements that emit other forms of radiation such as infrared or ultraviolet radiation may also be used if desired in the present invention in place of or in combination with light-emitting elements.

The term "diffuser" is used to define a device that scatters incident electromagnetic radiation, including visible light, infrared and ultraviolet radiation by means of diffuse transmission, refraction or reflection into a variety of irradiance distribution patterns.

The term "array" is used to define a linear 1D or planar 2D arrangement of one or more light-emitting elements.

Unless defined otherwise, all technical and scientific terms used herein have the same meaning as commonly understood by one of ordinary skill in the art to which this invention belongs.

The present invention provides a sealed housing unit and a method for its manufacture, wherein the sealed housing unit can protect light-emitting elements and the connected electronic circuitry from moisture. The sealed housing unit comprises a thermally conductive base onto which an array of light-emitting elements is mounted. A frame is sealingly connected to the thermally conductive base circumferentially enclosing the array of light-emitting elements and connected circuitry. An optically transmissive panel sufficiently sized to span the area defined by the frame, is sealingly connected to the frame to form a sealed cavity enclosing the array of light-emitting elements and the connected circuitry. The light-emitting elements can be electrically activated via electrical wires provided through one or more apertures within the thermally conductive base or the frame. Each aperture comprises a form of sealing means which suppresses the penetration of moisture, dust or other deleterious ingress.

Figure 1:
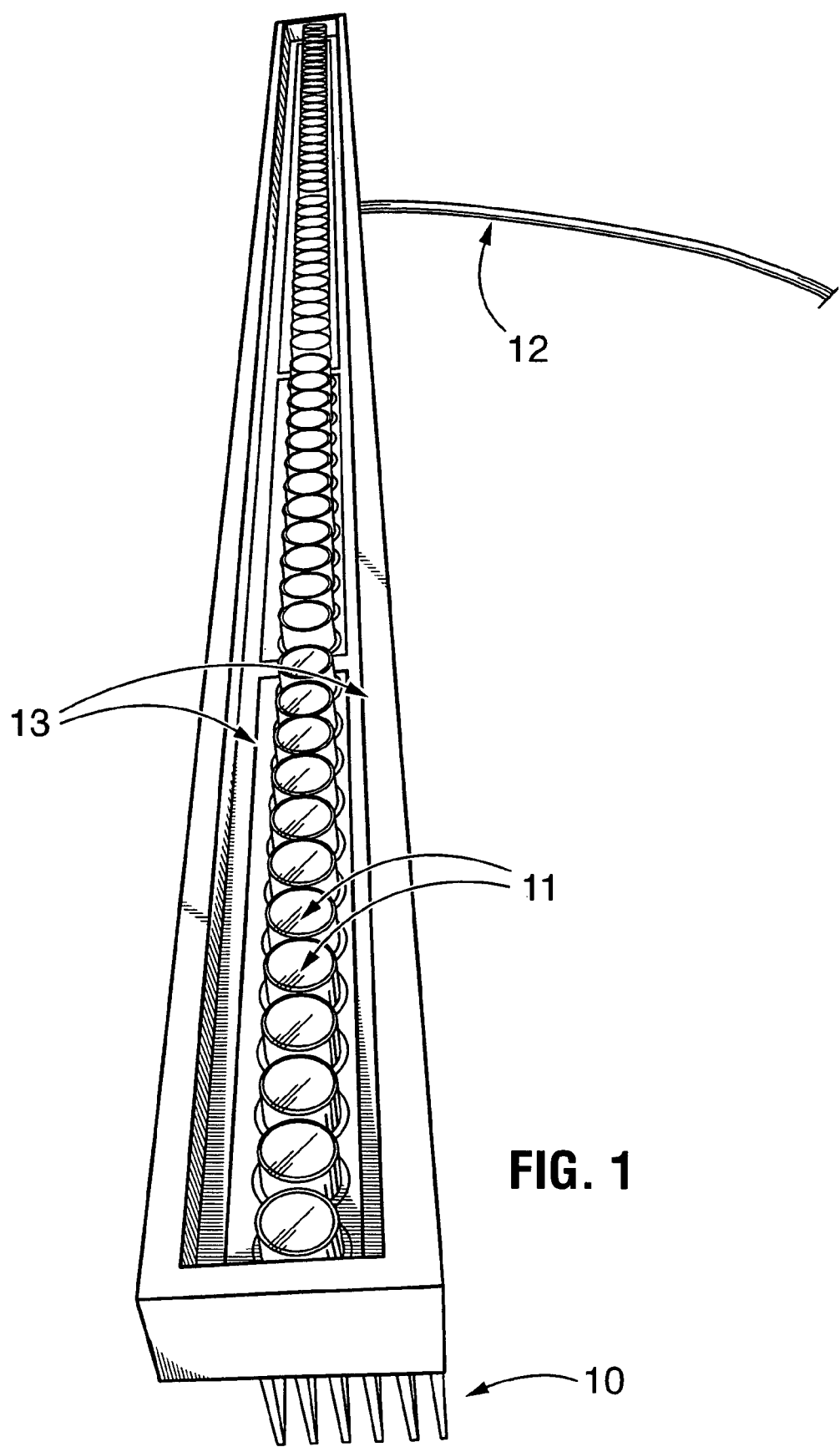
FIG. 1 illustrates the sealed housing unit according to one embodiment of the present invention.
Figure 2:
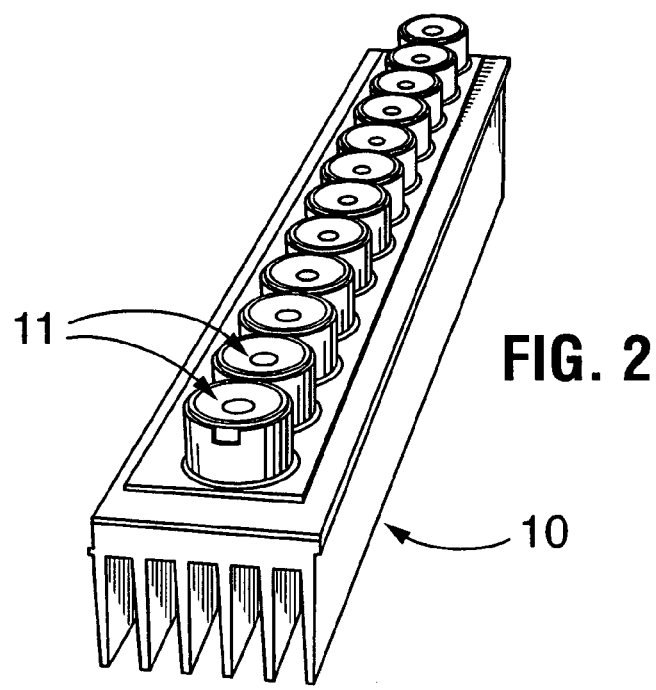
FIG. 2 illustrates one embodiment of the present invention wherein an array of light-emitting elements is mounted to a thermally conductive base which acts as a heat sink.

FIG. 1 illustrates an embodiment of the present invention that provides a sealed housing unit for enclosing an array of light-emitting elements. The sealed housing unit comprises a thermally conductive base 10 which acts as a heat sink, wherein an array of LEDs 11 is mounted onto the thermally conductive base 10. The LEDs are connected to wires of a cable 12 which passes through a fitting in the thermally conductive base and the cable is connected to an external power supply. In addition, a frame is sealingly connected to the thermally conductive base surrounding the array of light-emitting elements and their related circuitry providing a separation distance between the thermally conductive base and a transmissive panel connected to the frame. For example the transmissive panel can be made of glass, plastic or other material as would be readily understood, and that can be sealingly connected to the frame resulting in a sealed unit enclosing the light-emitting elements and the connected circuitry. FIG. 2 illustrates one embodiment of the present invention wherein an array of LEDs 11 is mounted to a thermally conductive base 10.

The thermally conductive base comprises an area to which the array of light-emitting elements can be mounted and it provides at least a first side to the sealed housing unit. The thermal conductivity of the base is required to conduct heat generated by the light-emitting elements during operation to a region outside of the sealed housing unit. The thermally conductive base can be formed into a heat sink or can be interconnected to a secondary heat dissipation system, for example a fluid cooling environment, enabling the transfer of heat away from the array of light-emitting elements. Other forms of heat removal apparatus can be interconnected with the thermally conductive base as would be readily understood by a worker skilled in the art.

The frame is sealingly connected to the thermally conductive base and provides a means for defining a space of sufficient height to enclose the light-emitting elements and their associated packaging within an enclosure defined by the thermally conductive base, the frame and the transmissive panel. In one embodiment wherein the array of light-emitting elements is a linear array, the frame can comprise two segments sealingly connected to the thermally conductive base along the long axis of the array and the ends of the array can be filled with an appropriate sealant rather than further providing a frame segment along the short axis of the array. Optionally, the frame can fully surround the array of light-emitting elements. As would be readily understood the shape of the frame can be any desired shape, size and material provided that the frame defines an area sufficient to enclose the desired array of light-emitting elements and the respective circuitry. In addition, the frame can be a protruding rim or any other integrally formed portion of the thermally conductive base.

Figure 3:
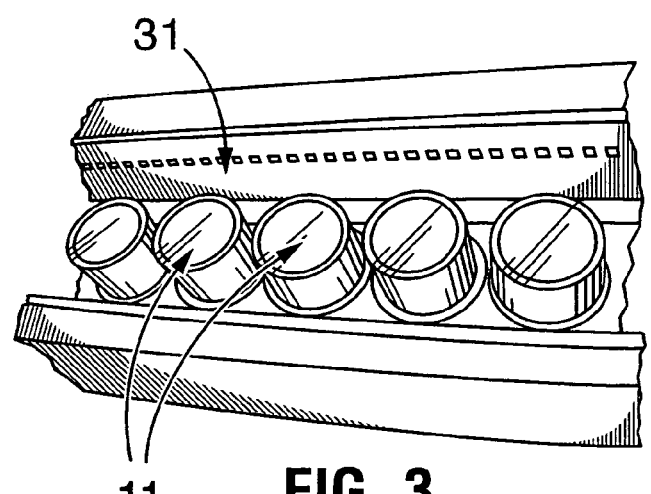
FIG. 3 illustrates a portion of the sealed housing unit according to one embodiment of the present invention.
Figure 4:
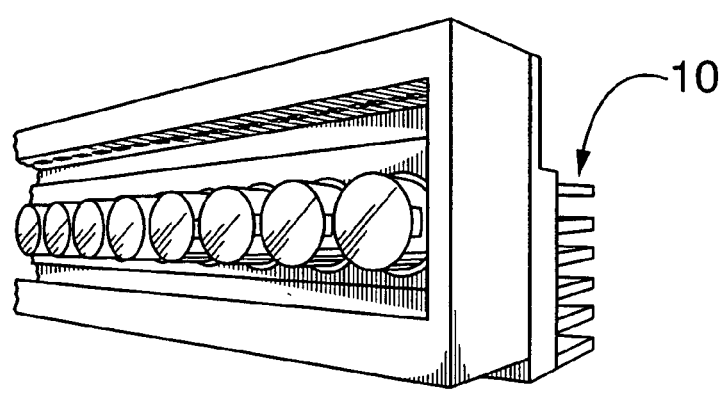
FIG. 4 illustrates an end detail of the sealed housing unit according to one embodiment of the present invention.

In one embodiment of the present invention, a desiccant or other hygroscopic material can be provided within the inside of the interior space defined by the frame, the transmissive panel and the thermally conductive base. In one embodiment, the face of the frame facing the interior space can have perforations or other porosities or openings or a moisture permeable membrane through which moisture can permeate into the frame that contains or integrally includes desiccant or other hygroscopic material. A desiccant or other hygroscopic material has a high affinity for water and as such may be used as a drying agent and thereby can reduce any adverse water damage due to water penetration into the sealed housing unit or residual water present during fabrication. By using the desiccant material in the assembly, the circuitry within the sealed housing unit can be protected from residual atmospheric moisture trapped within the sealed housing unit at the time of manufacture. In addition, the drying agent can reduce the adverse effects of moisture ingress into the sealed housing unit. FIG. 3 illustrates one embodiment of the present invention wherein the frame is fabricated from a frame of desiccant filled segments 31, wherein the face of the frame facing the interior space of the sealed housing unit is perforated for water penetration.

In one embodiment of the present invention, wherein the array of light-emitting elements is two dimensional, additional interior spacing elements in the form of spacer bars can be positioned within the array of light-emitting elements in order to provide structural support to the transmissive panel, for example. In this example, the two internal faces of the additional interior spacing elements may be perforated or comprise openings having a moisture permeable membrane associated therewith when these additional spacing elements comprise desiccant or other hygroscopic material therein.

These interior spacing elements may be interconnected to one or both of the transmissive panel and the thermally conductive base, however, this connection may not be required to be a sealed connection. Additionally, if the interior spacing elements are interconnected to both the thermally conductive base and the transmissive panel, this connection should be flexible in order to account for differential thermal expansion, as would be readily understood.

The transmissive panel can be an optically clear or diffuse transparent material including glass or plastic or any other suitable material or combination of materials. In an optional embodiment of the present invention, the panel can additionally be a diffuser or further comprise one or more integrated optics, for example Fresnel or lenticular lenses for manipulating the light originating from the light-emitting elements. In an alternate embodiment the panel can be flat or curved provided that it is able to form a sealed connection with the frame.

In one embodiment of the present invention, one or more optical elements are additionally connected to the thermally conductive base proximate to one or more of the light-emitting elements in order to provide a means for optically manipulating the illumination generated by the one or more of the light-emitting elements. In this embodiment, the space defined by the thermally conductive base, the transmissive panel and the frame is sufficient to enclose the one or more desired optical elements. These optical element can be for example, reflectors of any of a variety of shapes, collectors or other optical element as would be known to a worker skilled in the art.

A sealant is used to sealingly interconnect the thermally conductive base, the transmissive panel and the frame and any open regions between the transmissive panel and the base in order to form the desired sealed interior space. The sealant can comprise hot fusible butyl rubber, silicone, silicone rubber or any other known sealant as would be readily understood by a worker skilled in the art. The combination of employed sealants can be defined by factors such as required flexibility and deformability, thereby mitigating the risk of sealing failure due to differential thermal strain between the transmissive panel and the thermally conductive base, for example.

As would be readily understood by a worker skilled in the art, the light-emitting elements can be individually mounted on the thermally conductive base or may be mounted on a circuit carrier such as a printed circuit board (PCB) or metal core PCB which is mounted onto the thermally conductive base and both of these configurations are to be considered within the scope of the present invention. The thermal contact between the circuit carrier and the thermally conductive base can be enhanced through the use of a thermally conductive adhesive or thermal grease or other material as would be readily understood by a worker skilled in the art.

Figure 5:
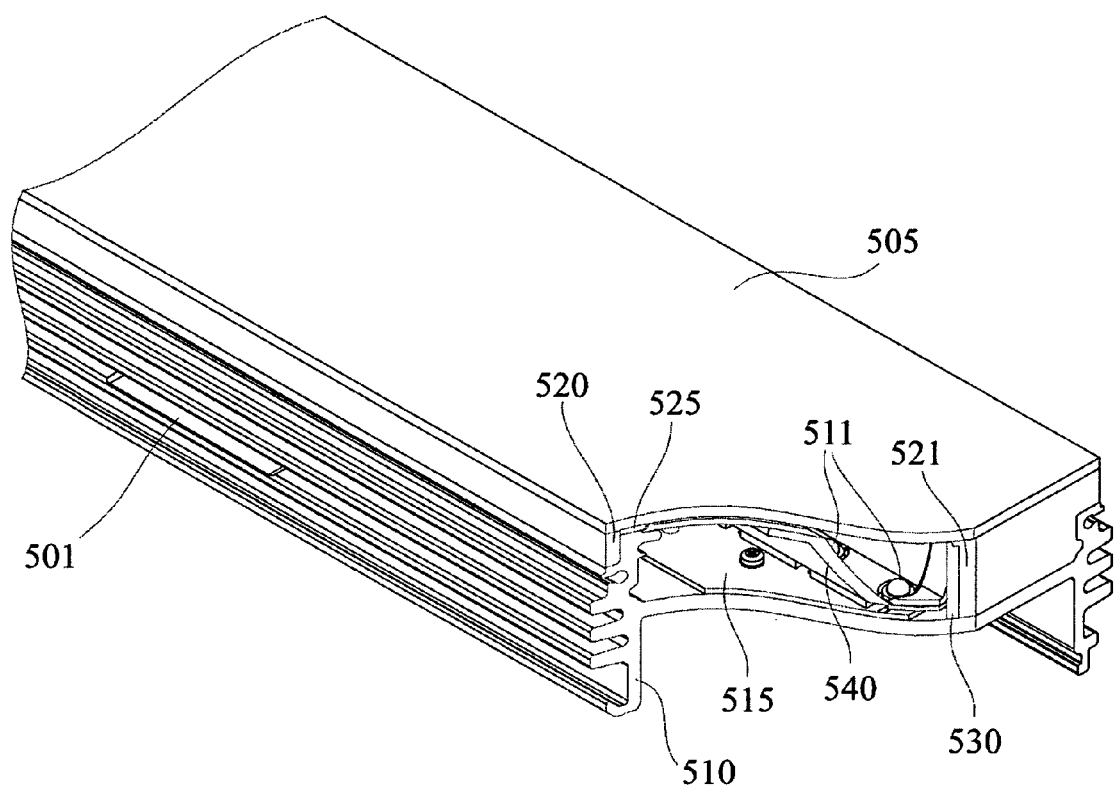
FIG. 5 illustrates another embodiment of the sealed housing unit with a cut-away section that reveals parts in the interior of the unit.

FIG. 5 illustrates another embodiment of a sealed housing unit in a cut-away view which shows parts of the interior of the unit. The unit comprises light-emitting elements 511 which are aligned in a one dimensional array and are in thermal contact with and mounted onto a circuit carrier 515 which is mechanically and thermally connected to a thermally conductive extruded profile or base 510. The light-emitting elements are aligned within an optical element 540 which can modify the light emitted by the light-emitting elements under operational conditions to help achieve a desired light output. The extruded profile has a protruding rim along its long axis which provides part of the enclosing frame for the array of light-emitting elements. A butyl tape 525 or other sealant is situated between the transparent panel 505 and the edge of the rim to attach and seal a connection. To improve the quality of the seal, the exterior of this connection 520 can be further secured and covered with silicone or silicone rubber, for example. A glass or plastic element 530 covers the end of the unit which is attached and secured by silicone or silicone rubber 521. The opposite end of the unit, which is not shown, can be covered in the same or a similar fashion. In addition, one or more ventilation apertures 501 as shown in FIG. 5 can provide for air flow through the side of the extruded profile in order to aid with heat dissipation for example, however this aperture is positioned outside of the enclosure formed with the thermally conductive extruded profile and the transmissive panel.

In one embodiment of the present invention, the sealed housing unit can be manufactured by mounting the array of light-emitting elements onto the thermally conductive base wherein they may be wired for external excitation through an aperture through the thermally conductive base or the frame, with the aperture being associated with an appropriate sealing fitting for example. A frame of sufficient height is positioned around the array of light-emitting elements to maintain a preferred distance between the thermally conductive base and the transmissive panel in order create a space to house the light-emitting elements and their associated packaging. A sealant such as butyl rubber may be used to bond and position the frame on the thermally conductive base. In one embodiment this frame may also comprise additional interior elements within the array of light-emitting elements thereby providing additional structural strength to the panel placed on top of the frame for example. The transmissive panel of transparent or diffuse material is subsequently positioned on top of the frame and a sealant such as butyl rubber may be used to bond and position the panel on the frame. In the next step silicone or another sealant as would be readily understood, is applied along the edges and interconnection locations between the thermally conductive base, the frame and the transmissive panel thereby bonding and sealing these elements into a single sealed housing unit.

This sealed housing unit for light-emitting elements can be more cost effective and simpler to manufacture compared with other sealed housing designs and can be integrated into a variety of lighting products including linear and planar arrays of light-emitting elements. Furthermore, this assembly is amenable to being built on existing automated equipment as would commonly be used to make double glazed window assemblies, for example.

Temperature Test

Figure 6:
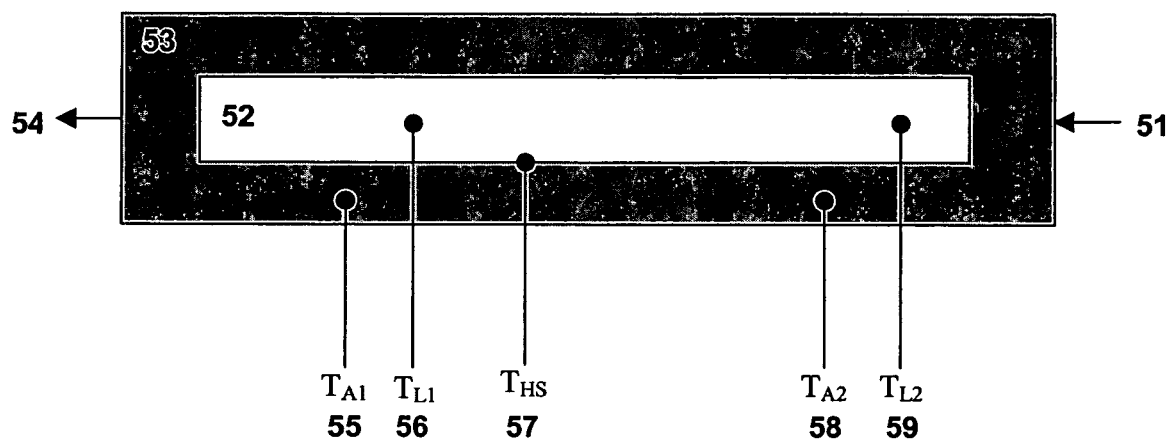
FIG. 6 illustrates the placement of temperature sensors in and around a sealed housing unit according to one embodiment of the present invention, for thermal testing of the unit.

Table 1 illustrates the parameters used for a temperature test performed on a sealed housing unit according to the present invention in order to evaluate the unit integrity while evaluating the temperature of the unit in an enclosed area of controlled temperature. This test further enabled the evaluation of the effects of differential expansion between the thermally conductive base and the transmissive panel, through paying particular attention to the integrity of the seals during testing. In this experiment, the tested sealed housing unit was a five-foot cove lighting unit with a thermally conductive base designed as a heat sink, the array of light-emitting elements is a linear array of LEDs. FIG. 6 graphically illustrates the positions of each of the temperature sensors collecting information during this experiment.

With further reference to FIG. 6, the sealed housing unit 52 was placed in a cardboard box 53, which was sealed with the exception of a small vent hole 54 at one end and having an opening at another end for the positioning of the external heat source 51, for example a heat gun, wherein the external heat source was used to raise the ambient temperature inside the box 53. While the sealed housing unit was operational and producing illumination, temperature readings were taken at 15 minute intervals at the five different locations illustrated in FIG. 6. Two temperature readings, $T_{A1}$ 55 and $T_{A2}$ 58, were taken at the two positions in the cardboard box which are indicated in FIG. 6 and were used to provide a measure of the ambient temperature. A third reading, $T_{HS}$ 57, was taken at the surface of the LED housing unit and fourth and fifth readings, $T_{L1}$ 56 and $T_{L2}$ 59, were taken at two positions within the sealed housing unit, as illustrated in FIG. 6.

TABLE 1

| | $T_{A1}$ | $T_{A2}$ | $T_{HS}$ | $T_{L1}$ | | $T_{L2}$ | |
|---|---|---|---|---|---|---|---|
| time minutes | degree centigrade | degree centigrade | degree centigrade | resistance Ohm | degree centigrade | resistance Ohm | degree centigrade |
| 0 | 76.4 | 48.8 | 70.8 | 1594 | 72 | 1880 | 68 |
| 15 | 71.9 | 49.4 | 73.2 | 1465 | 75 | 1733 | 70 |
| 30 | 75.5 | 56.5 | 78.6 | 1242 | 80 | 1468 | 75 |
| 45 | 77.9 | 54.2 | 80.1 | 1182 | 82 | 1394 | 78 |
| 60 | 81.1 | 73.1 | 82.1 | 1121 | 83 | 1321 | 79 |
| 75 | 81.2 | 74.1 | 82.7 | 1090 | 84 | 1283 | 80 |

At the termination of the experiment after a total of 75 minutes of operation of the LEDs, the internal temperature within the sealed housing unit reached a maximum of 84° C. and the LEDs were still fully operational. In addition the integrity of the seals enclosing and sealing the heat sink, frame and the transmissive panel together to form the sealed housing unit, were still intact.

The embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A sealed housing unit for a lighting system, the sealed housing unit comprising:
   (a) a thermally conductive base;
   (b) a frame sealingly connected to the thermally conductive base, wherein said frame is hollow and has an interior surface which includes a means for allowing ingress of water or water vapor into the frame;
   (c) an array of light-emitting elements in thermal contact with the thermally conductive base, the array is surrounded by the frame, wherein the interior surface of the frame faces the array;
   (d) an optically transmissive panel sealingly connected to the frame;
   (e) sealing means associated with the thermally conductive base, the frame and the transmissive panel forming a sealed housing unit enclosing the array of light-emitting elements; and
   (f) a desiccant or hygroscopic material placed within the frame;

wherein said light-emitting elements are electrically connected to a power source through at least one sealing aperture in the thermally conductive base or the frame.

2. The unit according to claim 1, wherein the interior surface comprises perforations or a permeable membrane for allowing ingress of water or water vapor into the frame.

3. The unit according to claim 1 wherein the frame and the thermally conductive base are an integrally formed body.

4. The unit according to claim 3 wherein the body has an extruded profile.

5. The unit according to claim 1 wherein the transmissive panel is optically transparent, translucent or has diffuse transmissive characteristics.

6. The unit according to claim 1 wherein the array of light-emitting elements is in direct thermal contact with the thermally conductive base.

7. The unit according to claim 1 further comprising a circuit carrier thermally connecting the thermally conductive base and thermally, electrically, and mechanically supporting the array of light-emitting elements.

8. The unit according to claim 1 wherein the sealing means is a flexible sealing material selected from the group comprising butyl, bitumen, silicone and silicone rubber.

9. The unit according to claim 1 further comprising one or more optical elements proximate to one or more of the light-emitting elements, said one or more optical elements for distributing the light emitted by the one or more light-emitting elements under operational conditions.

10. The unit according to claim 1 further comprising a circuit carrier thermally connected to the thermally conductive base, said circuit carrier providing electrical connectivity to the array of light-emitting elements mounted thereon.

11. The unit according to claim 10, wherein a thermal adhesive or a thermal grease enhances thermal connection between the circuit carrier and the thermally conductive base.

12. The unit according to claim 10, wherein the circuit carrier is a metal core PCB.

13. A method for assembling a sealed housing unit for a lighting system, the method comprising the steps of connecting a frame and an array of light-emitting elements to a thermally conductive base, wherein the frame surrounds the array, wherein the frame is hollow and has a desiccant or hygroscopic material therein, the frame having an interior surface which includes a means for allowing ingress of water or water vapor into the frame and the interior surface of the frame facing the array; providing electrical connection to the array of light-emitting elements though at least one sealing aperture in the thermally conductive base or frame; and sealingly connecting an optically transmissive panel to the frame; whereby the frame is sealingly connected to the thermally conductive base and the optically transmissive panel to form a sealed housing unit enclosing the array of light-emitting elements.

14. The method according to claim 13 wherein the array of light-emitting elements is thermally connected to the thermally conductive base before the frame is sealingly connected to the thermally conductive base.

15. The method according to claim 13 wherein the frame is sealingly connected to the thermally conductive base before the array of light-emitting elements is thermally connected to the thermally conductive base.

* * * * *